United States Patent [19]

Sugimoto

[11] Patent Number: 4,516,074

[45] Date of Patent: May 7, 1985

[54] NUCLEAR MAGNETIC RESONANCE DIAGNOSTIC APPARATUS

[75] Inventor: Hiroshi Sugimoto, Tochigi, Japan

[73] Assignee: Tokyo Shibaura Denki Kabushiki Kaisha, Japan

[21] Appl. No.: 413,425

[22] Filed: Aug. 31, 1982

[30] Foreign Application Priority Data

Aug. 31, 1981 [JP] Japan .................. 56-135424

[51] Int. Cl.³ .................. G01N 27/00; A61B 5/05
[52] U.S. Cl. .................. 324/309; 128/653
[58] Field of Search .................. 128/653; 324/309

[56] References Cited

U.S. PATENT DOCUMENTS 4,254,778 3/1981 Clow et al. .................. 128/653
4,322,684 3/1982 Hounsfield .................. 324/309

OTHER PUBLICATIONS

Lindberg, D. A. B. et al., "Digital Image Processing in Medicine", Proceedings Hamburg, Germany, Oct. 1981, pp. 21-22.

Primary Examiner—Kyle L. Howell
Assistant Examiner—Francis J. Jaworski
Attorney, Agent, or Firm—Finnegan, Henderson, Farabow, Garrett & Dunner

[57] ABSTRACT

Nuclear magnetic resonance diagnostic apparatus including a coil for generating a gradient field in a plane perpendicular to a static magnetic field, means for controlling the operation of the coil to rotationally shift in angular steps the gradient direction of the gradient field at an angle pitch of some multiple of the unit index angle through a plurality of rotations to assume all the shift positions of the gradient direction, a rough image reconstructor for reconstructing a rough tomographic image on the basis of nuclear magnetic resonance signals acquired during a rotation of the second gradient magnetic field, a rough image display for depicting the rough tomographic image, a final image reconstructor for reconstructing a final tomographic image on the basis of all nuclear magnetic resonance signals corresponding to all of the expected rotation shift positions acquired during a plurality of rotations and a final image display for depicting the final tomographic image.

8 Claims, 5 Drawing Figures

THE GRADIENT DIRECTION OF GRADIENT MAGNETIC FIELD
IN A SLICE ALONG THE X-Y CO-ORDINATE
→ 1 TO 12
→ 13 TO 24
→→ 25 TO 36

NUCLEAR MAGNETIC RESONANCE DIAGNOSTIC APPARATUS

FIELD OF THE INVENTION

This invention relates to nuclear magnetic resonance (NMR) diagnostic apparatus in which the nuclear magnetic resonance signals due to specified atomic nuclei in certain tissues of a living body can be measured in a noninvasive manner from outside of the object utilizing nuclear magnetic resonance (NMR) phenomena to obtain useful information for medical diagnostic purposes.

BACKGROUND OF THE INVENTION

Shown in FIG. 1 is the schematic construction of a conventional apparatus in which the NMR signals due to specified atomic nuclei such as the atomic nuclei of hydrogen in an object can be measured while generating both a uniform static magnetic field and a gradient magnetic field.

Referring to FIG. 1, an oscillator 1 generates high frequency pulses which are applied to a coil system 2 positioned around the object 3 in order to detect the NMR signals to be issued therefrom. Coil system 2 may be formed with the coils of a shape as shown in FIG. 5 of U.S. Pat. No. 4,254,778 issued to Clow et al. An amplifier 4 amplifies those NMR signals and analog-to-digital converter 5 converts the amplified NMR signals to digital ones. A reconstructor 6 reconstructs the tomographic image of the object on basis of those digital NMR signals, the resultant tomographic image being depicted on a display 7. Cylindrical magnetic field coils 8a, 8b, 8c and 8d are supplied D.C. voltage by a stabilized source 9 to generate a uniform static magnetic field for applying it to the object 3. Gradient magnetic field coils 10 being similar to ones shown in FIG. 3 of the above-mentioned U.S. patent, generate a gradient magnetic field in a plane perpendicular to the static magnetic field direction, whose gradient direction is shifted rotatively. The gradient field coils 10 are supplied D.C. voltage by a source supply 11, the timing of all the NMR diagnostic apparatus being controlled by a controller 12.

The operation of the above constructed NMR diagnostic apparatus will be explained as follows.

The uniform static magnetic field (Ho) due to the cylindrical magnetic field coils 8a to 8d is applied to the object 3 and the gradient magnetic field due to gradient magnetic coil 10 is also applied in a particular direction to the object 3 superimposed on the static field. While rotating the gradient direction of the gradient field in the slice of object 3 through 360°, high frequency pulses whose central frequency is adjusted to be the resonance frequency are issued from oscillator 1 to apply to the object 3 through coil system 2. The resultant NMR signals are detected by coil 2 and after amplification due to amplifier 4, converted to digital signals by an analog-to-digital converter 5. Since these digital signals are in correspondence to the Fourier-transformed original projection signals, after Fourier-transforming for every gradient direction of the gradient magnetic field in reconstructor 6, a reconstruction procedure is performed. The resulting tomographic image of object 3 obtained by such a procedure is depicted on display 7.

However, the above-mentioned NMR diagnostic apparatus has the following disadvantages. For both the NMR diagnostic apparatus and also tomographic apparatus utilizing such a reconstruction method, after the acquisition of signals in a variety of directions in the slice of the object, the reconstruction process is performed to obtain tomographic images. In the case of X-ray computed tomographic (CT) apparatus, since the detected signals are obtained within a few seconds after performing the X-ray beam scan, the time from starting the scan to completing the display of a tomographic image is mostly occupied with the calculation time involved in the reconstruction procedure, its calculation time being as short as 30 seconds. Accordingly, even if the desired tomographic image was not obtained because of an error in slice positioning, body-motion of the object during the scan or the like, remeasurement for an X-ray CT apparatus can be performed without undue delay.

However, in the case of NMR diagnostic apparatus the detection of NMR signals requires several minutes. Accordingly, the total time of diagnosis could be excessive if remeasurement after performing the reconstruction procedure is required on the basis of the detected NMR signals and display of the tomographic image.

Furthermore, there is a diagnostic method of obtaining a tomographic image of the object after injecting a contrast medium into the object and reconstructing the same slice many times. The alteration of various organs in the same slice with the lapse of time can thereby be observed. If such a diagnostic method is performed using NMR diagnostic apparatus, the safety of the object is greater than if an X-ray CT apparatus is used because ionizing radiation exposure is nonexistent. However, using prior art systems several minutes for detection of NMR signals are necessary for the reconstruction of a tomographic image as previously described, and it is consequently impossible to perform this type of diagnostic method with the NMR diagnostic apparatus.

It is therefore an object of the present invention to provide a nuclear magnetic resonance diagnostic apparatus wherein a rough tomographic image is reconstructed before acquiring a final tomographic image, thereby enabling a quick decision to be made whether a remeasurement is necessary and also to observe a time-lapse change in an object's slice without excessive and disruptive delays.

Additional objects and advantages of the invention will be set forth in the description which follows, and will be obvious from the description or may be learned by practice of the invention. The objects and advantages of the invention may be realized by means of the apparatus and combinations particularly pointed out in the appended claims.

SUMMARY OF THE INVENTION

To achieve the foregoing objects, and in accordance with the purpose of the invention as embodied and broadly described herein, nuclear magnetic resonance diagnostic apparatus is provided wherein a uniform static magnetic field is generated, a first gradient magnetic field is superimposed on the static magnetic field aligned in the direction of the static magnetic field, and a second gradient magnetic field is superimposed on both the static magnetic field and the first gradient magnetic field in a direction perpendicular to the static magnetic field direction. The gradient direction of the second gradient magnetic field is rotatively shifted some unit index angle at a time until it is rotated substantially 360 degrees to acquire the tomographic image on the basis of nuclear magnetic resonance signals due to specified atomic nuclei existing within a slice of an object. The NMR diagnostic apparatus comprises: (a) coil means for generating the second gradient magnetic field; (b) means for controlling the operation of the coil means to rotatively shift the gradient direction of the second gradient field in a slice of an object to be diagnosed in angular steps equivalent to several times the unit index angle until the gradient direction is rotated through a plurality of rotations to assume all of the expected rotative shift positions of the second gradient direction; (c) a memory device for storing nuclear magnetic resonance signals for each gradient direction of the second gradient magnetic field; (d) a rough image reconstructor for reconstructing a rough tomographic image on the basis of nuclear magnetic resonance signals acquired during a single rotation of the gradient direction of the second gradient magnetic field; (e) a first image display for depicting the rough tomographic image; (f) a final image reconstructor for reconstructing a final tomographic image on the basis of nuclear magnetic resonance signals corresponding to all of the expected rotation shift positions acquired during a plurality of rotations; and (g) a second image display for depicting the final tomographic image.

BRIEF DESCRIPTION OF THE DRAWINGS

The accompanying drawings, which are incorporated in and constitute a part of the specification, illustrate a preferred embodiment of the invention and, together with the general description of the invention given above, and the detailed description of a preferred embodiment given below, serve to explain the principles of the invention.

DESCRIPTION OF THE PREFERRED EMBODIMENTS

Reference will now be made in detail to the present preferred embodiment of the invention as illustrated in the accompanying drawings.

Figure 1:
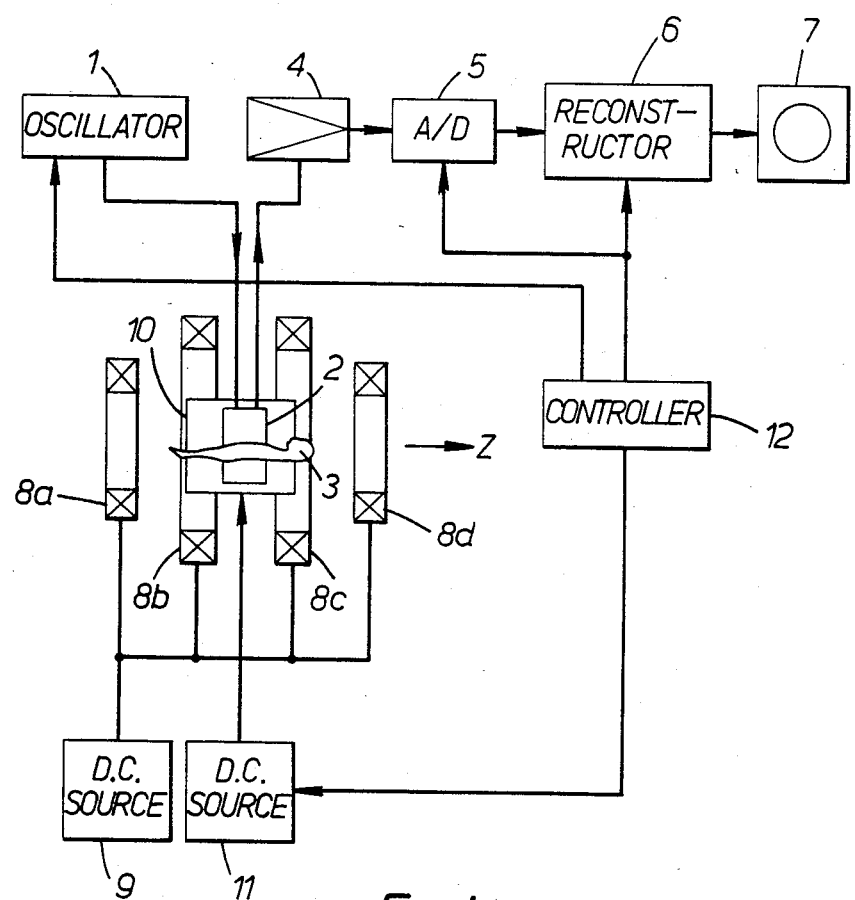
FIG. 1 is a block diagram illustrating a conventional NMR diagnostic apparatus.
Figure 2:
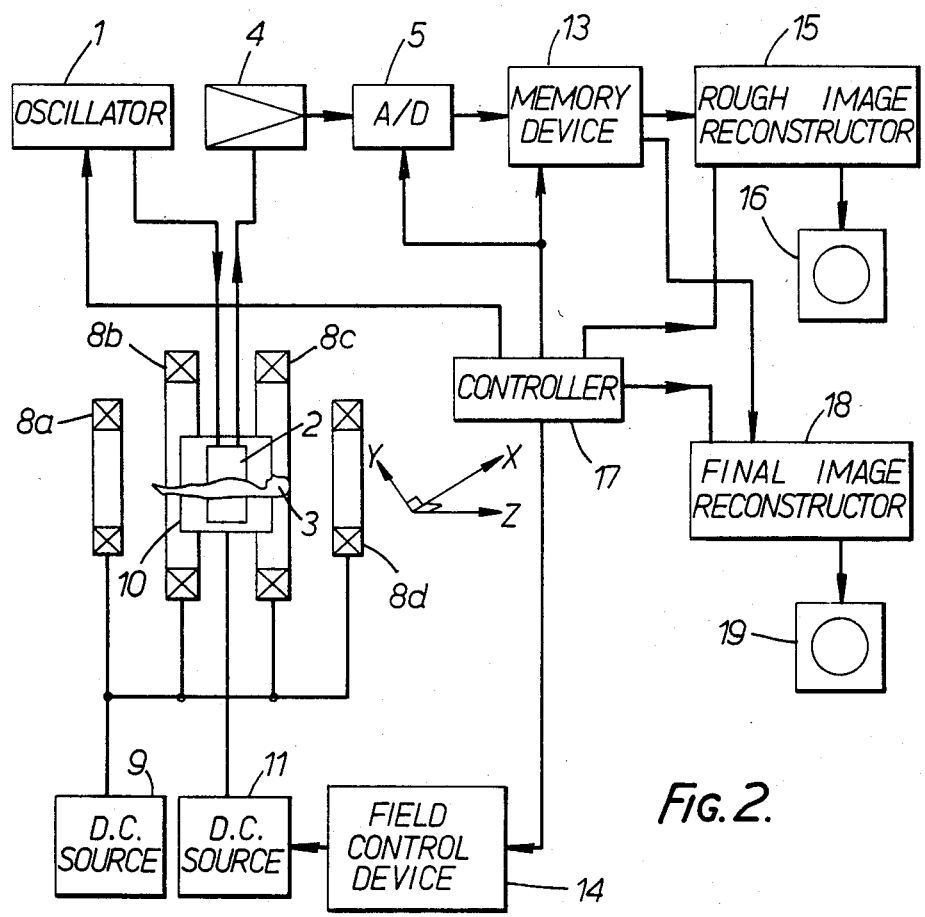
FIG. 2 is a block diagram illustrating an embodiment of this invention.

Referring to FIG. 2, an oscillator 1 generates a high frequency pulse having a frequency equal to the NMR frequency of the specified atomic nuclei such as the atomic nuclei of hydrogen existing in an object 3. The high frequency pulse is applied to object 3 through a coil system 2 to obtain an NMR signal. The NMR signal detected by coil 2 is amplified by an amplifier 4 and then converted to a digital signal by an analog-to-digital convertor 5. A memory device 13 includes, for example, a magnetic disc device on which the digital converted NMR signal can be stored and from which it can be read out rapidly.

Cylindrical magnetic field coils 8a, 8b, 8c and 8d are supplied D.C. voltage by a stabilized source supply 9 and apply a uniform static magnetic field in the space containing object 3. A gradient magnetic field coil 10 is supplied D.C. voltage by a source supply 11 for the NMR signal position as a frequency difference to the resonance signal. A gradient magnetic field control device 14 controls the operation of the gradient magnetic field coil to rotatively shift it to all the gradient directions of the gradient magnetic field. This is accomplished by rotating the gradient direction M times (M: integer) then rotatively shifting the gradient direction of the gradient magnetic field every N times (N: integer) as many as the rotation indexing angle. A first image reconstructor 15, by reading out the digitalized NMR signals stored in memory device 13 after rotating the gradient direction of the gradient magnetic field, reconstructs a rough tomographic image according to those NMR signals. The rough tomographic image reconstructed by image reconstructor 15 is depicted on image display 16. A controller 17 controls entirely the timing of NMR diagnostic apparatus.

There will be explained now the operation of the gradient magnetic field coil 10, source supply 11 and gradient magnetic field control device 14 in more detail.

If a slice of the object is presumed to lie in the X-Y plane, there is gradient magnetic field coil 10 generating fields in the X and Y directions, respectively. The gradient direction of the gradient magnetic field is the vector sum of the magnetic fields due to gradient magnetic field coil 10 in the X and Y directions. When the gradient direction is rotated, the operation of gradient magnetic field coil 10 in the X direction is identical with the one in the Y direction, but the direction is changed by phase shifting using the gradient magnetic field control device 14.

Figure 3:
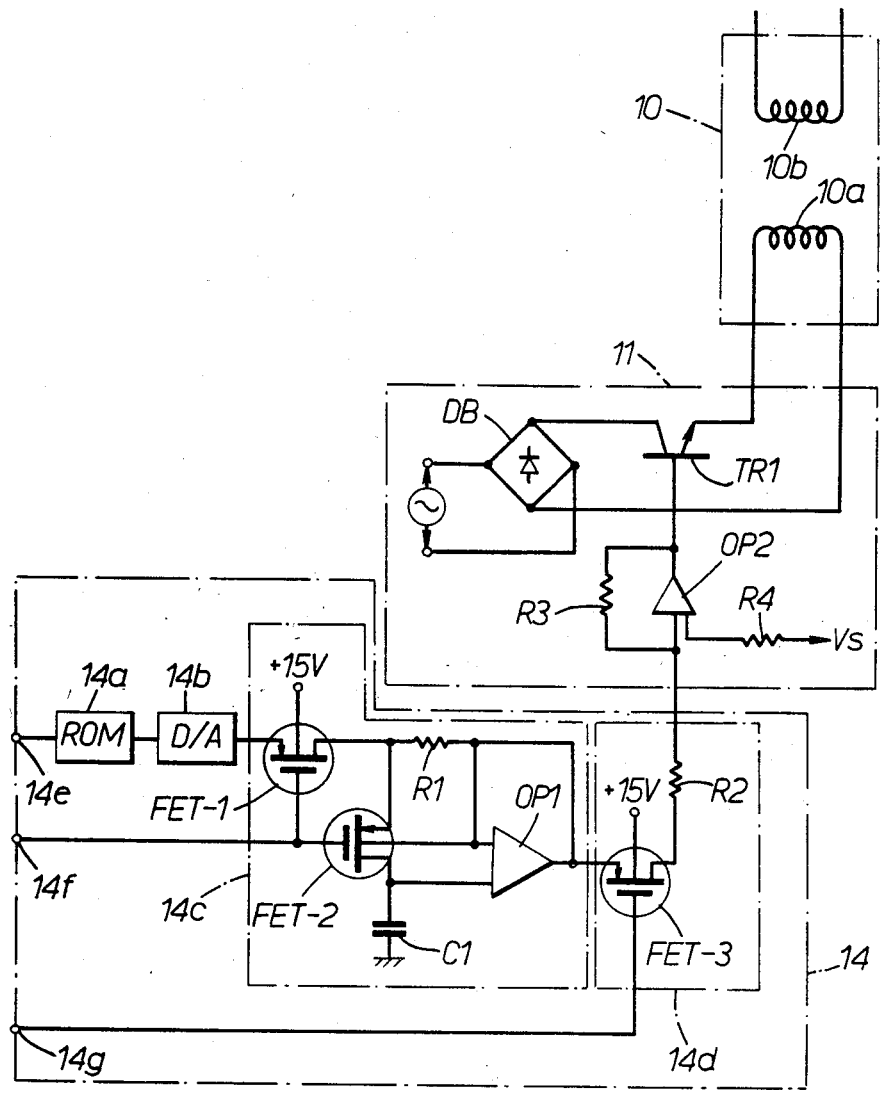
FIG. 3 is a block diagram illustrating a gradient magnetic field control device of the apparatus of FIG. 2.

Typically as shown in FIG. 3, the gradient magnetic field control device 14 is provided with a read only memory (ROM) 14A, digital-to-analog convertor (D/A convertor) 14b, sample hold circuit 14c and analog switch 14d. The values of the current applied to the gradient magnetic field coil 10a which correspond to the different gradient directions of the gradient magnetic field, are written on ROM 14a in the appropriate order to sequentially select the gradient direction. When an instruction signal for beginning the rotation shift of gradient direction is applied to a signal terminal 14e from controller 17, those written on current values are subsequently applied to D/A convertor 14b according to the instruction signal in the desired order. D/A convertor 14b converts the digital value issued from ROM 14a to an analog signal to transmit it to sample hold circuit 14c. Sample hold circuit 14c is provided with two field effect type transistors FET1 and FET2, an operational amplifier OP1, a resistor R1 and a condenser C1. When the instruction signal for sample hold issued from controller 17 is applied to a signal terminal 14f synchronizing with the instruction signal for the rotating shift of gradient direction applied to terminal 14e, the sample hold circuit 14c retains the analog signal delivered from D/A convertor 14b to issue to analog switch 14d. The analog switch 14d comprising a field effect transistor FET3 and resistor R2, applies the held analog signal to source supply 11 responsive to the instruction signal applied from the controller 17 through the signal terminal 14g.

The source supply 11 comprises an operational amplifier OP2, resistors R3 and R4 and transistor TR1. When no signal is delivered through resistor R2 of analog switch 14d, transistor TR1 is cut off by a reference voltage VS at resistor R4. When a signal appears on resistor R2, the transistor TR1 is turned on to cause current to flow in gradient magnetic field coil 10a. The source supply 11 is provided with a bridge diode circuit DB as well.

Although the indexing angle in practice is, for example 1 degree, it is assumed here to be 10 degrees for purposes of simplifying the explanation.

Figure 4:
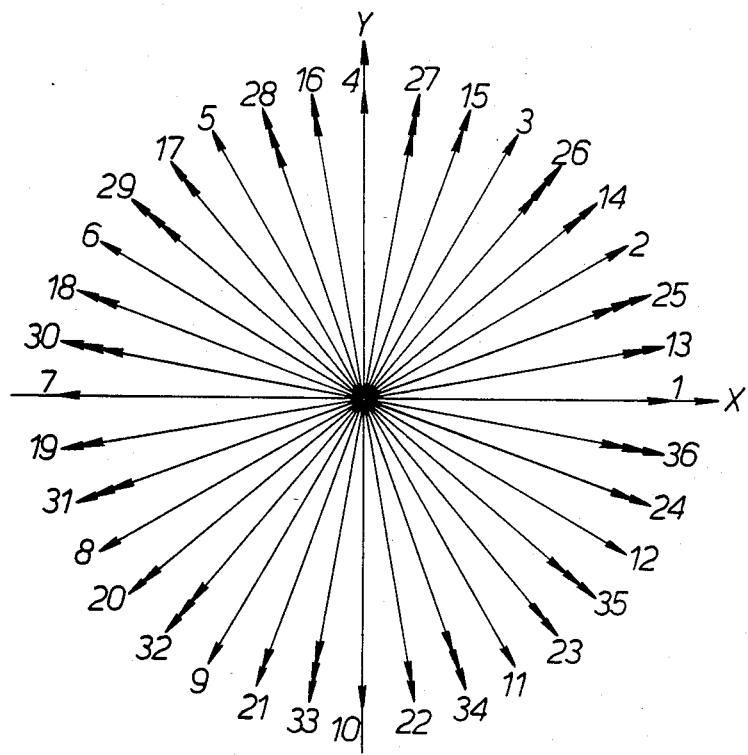
FIG. 4 is a schematic presentation for explaining the rotative shift of the gradient direction of the gradient magnetic field in relation to the invention.

In the present NMR diagnostic apparatus, a final tomographic image is produced, as shown in FIG. 4, by rotating the gradient direction of the gradient magnetic field in all 36 directions. In this case, the rotational shift order of the gradient direction is determined as follows. As the rotational shift order of the gradient direction is illustrated by the affixed numbers, the rotational shift of the gradient direction is set at an angle (30 degrees) of three times the index angle (10 degrees) and the shift is accomplished in order of numbers 1, 2, ..., 11 and 12 to complete one rotation. Subsequently, the initial position of the gradient direction of the field is moved to the 13th position and then the second rotation of the gradient direction shift is performed in order of numbers 13, 14, ..., 23 and 24. In the same manner, a third rotation is performed in order of numbers 25, 26, ..., 35 and 36 after the initial position is set at the 25th position.

The above described order in which the gradient direction of the field is shifted rotationally, is written on ROM 14a in the gradient magnetic field control device 14. As shown in FIG. 2, a uniform static magnetic field generated by cylindrical magnetic field coils 8a to 8d connected to stabilized source 9, is applied to object 3 in the Z direction. A gradient magnetic field which is generated by gradient magnetic field coil 10 is simultaneously applied to object 3. The gradient direction of the field is controlled by gradient magnetic field control device 14. Further, a high frequency pulse from oscillator 1 is applied to object 3 through coil system 2.

While the gradient direction of the gradient magnetic field is rotationally shifted in the order shown by FIG. 4, the detected NMR signals for each gradient direction of the gradient magnetic field are amplified by amplifier 4, converted to digital signals and subsequently stored in memory device 13.

When the first rotation of gradient direction of the gradient magnetic field is performed, for example, in order of the numbers 1, 2, ..., 11 and 12 of FIG. 4, a first rough tomographic image is reconstructed by the rough image reconstructor 15 on the basis of NMR signals detected in each of the gradient directions. Subsequently, as the second rotation of gradient direction is performed in order of the numbers 13, 14, ..., 23 and 24, a second rough tomographic image is reconstructed on the basis of the further NMR signals detected in the gradient directions 13, 14, ..., 23 and 24, and the NMR signals which have already been detected by the first rotation. The reconstructed first and second images are subsequently depicted on rough image display 16.

As an operator finds slice-mispositioning, body-movement of object 3, or the like on rough image display 16, the measurement procedure will be suspended and then rapidly resumed after correcting the problem. When there is no need for remeasurement, the measurement is continued until all of the NMR signals detected in all rotational shift positions (36 directions) of the gradient direction of gradient magnetic field are stored in memory device 13. Subsequently, all the NMR signals are applied to the final image reconstructor 18 after read out from the memory device 13. The final image reconstructor 18 reconstructs the finally refined tomographic image of the specified slice; the refined image being depicted on final image display 19.

As should be apparent to those skilled in the art, modifications and variations can be made in the above disclosed embodiment without departing from the scope or spirit of the invention.

Figure 5:
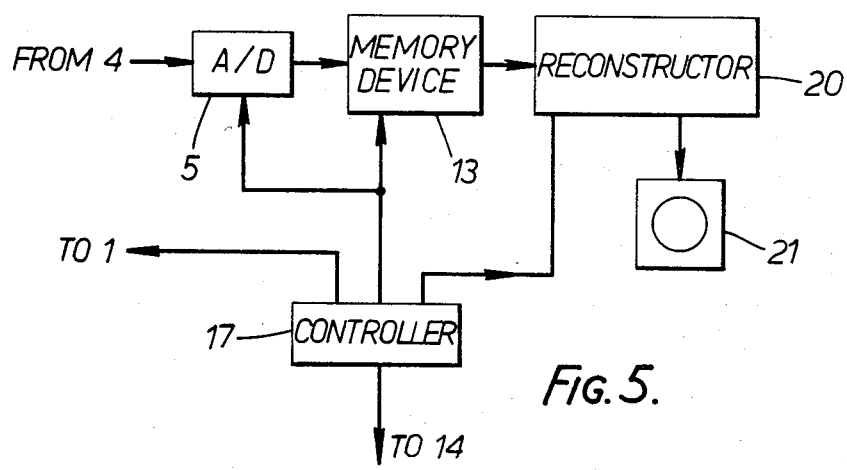
FIG. 5 is a block diagram illustrating a subject part of another embodiment of the invention.

As stated above, a preferred embodiment is provided with a rough image reconstructor and a separate final image reconstructor, as well as a rough image display and final image display. A modification to such a construction is shown in FIG. 5. This embodiment includes a reconstructor 20 which can construct both a rough image and final image, and a display 21 which can depict both a rough image and final image. However, if two reconstructors and two displays are used in place of the single reconstructor and display, the construction of the NMR diagnostic apparatus can be simplified.

Also, in the embodiment of FIG. 5, a rough image depicted on the rough image display is constructed on the basis of all NMR signals which have been stored on the memory device up to a particular time, i.e. for rotations of the gradient direction of the gradient magnetic field to that point in time. According to this embodiment, the tomographic image in the second rotation is necessarily more distinct and better defined than that after the first rotation and the tomographic image after the third rotation is necessarily more distinct and well defined than after the second rotation. As a modification to this construction, a reconstructor can be used which constructs a rough image on the basis of only NMR signals detected during a single rotation. According to this embodiment, the reconstruction procedure time of the reconstructor is shortened because a rough image is reconstructed with only the NMR signals detected for a single rotation of the gradient direction of the gradient magnetic field.

Furthermore, in accordance with this invention the gradient direction of the gradient magnetic field is rotated a plurality of times using a rotation pitch of several times the original index angle and shifting the initial position of the gradient direction for each subsequent rotation. The rotation of the gradient direction of the gradient magnetic field is performed several times, and the rotation of gradient direction must be ordered in a manner to assume all the index angle positions at some point in time. Therefore, as another modification, a system as shown in FIG. 4 can operate so that the first rotation of the gradient direction of gradient magnetic field is performed in order of the numbers 1, 2, ..., 11 and 12, the second rotation in order of the numbers 25, 26, ..., 35 and 36, and the third (last) rotation in order of the numbers 13, 14, ..., 23 and 24.

Furthermore, the above stated embodiment depicts on the display a tomographic image reconstructed after each rotation of the gradient direction of the gradient magnetic field. As a further modification to such a construction, an NMR diagnostic apparatus can be used in which the reconstruction is performed on the basis of NMR signals which are acquired during each rotation, all the gradient directions of a given rotation being permitted to define an image. Each of a plurality of rough tomographic images acquired in this way for a plurality of rotations of the gradient direction can be simultaneously depicted in divided displaying regions on a display in accordance with the lapse of time. With such a display, an operator can observe the time-lapse variation of the slice so that he can make a proper diagnosis of the object. In this case, the operator can distinctly appreciate the variation of organs at separate times being able to observe a difference between a final image and each of the rough images on the display.

What is claimed is:

1. Nuclear magnetic resonance diagnostic apparatus wherein a uniform static magnetic field is generated, a first gradient magnetic field is superimposed on said static magnetic field in the direction of said static magnetic field, a second gradient magnetic field is superimposed on both said static magnetic field and said first gradient magnetic field in a direction perpendicular to said magnetic field direction, and the gradient direction of said second gradient magnetic field is rotationally shifted through a plurality of steps substantially equal to 360 degrees divided by some unit index angle rotated to acquire a tomographic image on the basis of nuclear magnetic resonance signals due to specified atomic nuclei existing within a slice of an object, the apparatus comprising:

coil means for generating said second gradient magnetic field;

means for controlling the operation of said coil means to rotationally shift in angular steps the gradient direction of said second gradient field in a slice of an object to be diagnosed where said angular step is a multiple of said index angle in a sequence to assume all of the gradient direction positions of said second gradient field;

a memory device for storing nuclear magnetic resonance signals for each gradient direction of said second gradient magnetic field;

a rough image reconstructor for reconstructing a rough tomographic image on the basis of nuclear magnetic resonance signals acquired during a rotation of the gradient direction of said second gradient magnetic field;

a rough image display for depicting said rough tomographic image;

a final image reconstructor for reconstructing a final tomographic image on the basis of nuclear magnetic resonance signals corresponding to all of the expected rotational shift positions acquired during a plurality of rotations; and a final image display for depicting said final tomographic image.

2. The nuclear magnetic resonance diagnostic apparatus of claim 1 wherein both said rough image reconstructor and said final image reconstructor are defined by a single reconstructor.

3. The nuclear magnetic resonance diagnostic apparatus of claim 1 wherein both said rough image display and said final image display are defined by one display.

4. The nuclear magnetic resonance diagnostic apparatus of claim 3 wherein both said rough image reconstructor and said final image reconstructor are defined by a single reconstructor.

5. The nuclear magnetic resonance diagnostic apparatus of claims 1, 2, 3 or 4 wherein said rough image reconstructor reconstructs a new tomographic image on the basis of all nuclear magnetic resonance signals detected after each rotation of the gradient direction of the gradient magnetic field.

6. The nuclear magnetic resonance diagnostic apparatus of claims 1, 2, 3 or 4 wherein said memory device includes a magnetic disc device.

7. The nuclear magnetic resonance diagnostic apparatus of any one of claims 1, 2, 3 or 4 wherein said rough image reconstructor sequentially reconstructs a tomographic image on the basis of nuclear magnetic resonance signals detected after each rotation of the gradient direction of the gradient magnetic field and said display depicts the tomographic images acquired after each rotation at different positions on said display in the order of time lapse.

8. The nuclear magnetic resonance diagnostic apparatus of claims 1, 2, 3, or 4 wherein said rough image reconstructor reconstructs a tomographic image on the basis of only nuclear magnetic resonance signals detected for each rotation of the gradient direction of the gradient magnetic field and said display depicts each of the tomographic images acquired for each rotation and the final image at different positions on said display in the order of time lapse.

* * * * *